(12) United States Patent
Van der Zanden et al.

(10) Patent No.: US 12,142,583 B2
(45) Date of Patent: Nov. 12, 2024

(54) RF AMPLIFIER PACKAGE

(71) Applicant: Ampleon Netherlands B.V., Nijmegen (NL)

(72) Inventors: Josephus Henricus Bartholomeus Van der Zanden, Nijmegen (NL); Daniel Maassen, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 478 days.

(21) Appl. No.: 17/536,589

(22) Filed: Nov. 29, 2021

(65) Prior Publication Data

US 2022/0173057 A1 Jun. 2, 2022

(30) Foreign Application Priority Data

Nov. 30, 2020 (NL) ...................................... 2027009

(51) Int. Cl.
*H03F 3/14* (2006.01)
*H01L 23/66* (2006.01)
(Continued)

(52) U.S. Cl.
CPC ............. *H01L 23/66* (2013.01); *H03F 1/565* (2013.01); *H03F 3/195* (2013.01);
(Continued)

(58) Field of Classification Search
CPC ............. H01L 23/66; H01L 2223/6611; H01L 2223/6655; H01L 24/48; H01L 24/49;
(Continued)

(56) References Cited

U.S. PATENT DOCUMENTS 10,763,227 B2 * 9/2020 Heeres ................... H03F 3/193
11,444,044 B2 * 9/2022 Khalil .................... H03F 3/195
(Continued)

FOREIGN PATENT DOCUMENTS

EP 3499717 A1 6/2019
WO 2020050719 A1 3/2020

OTHER PUBLICATIONS

PCT International Search Report and Written Opinion, Application No. NL2027009, dated Jul. 30, 2021, 10 pages.

*Primary Examiner* — Khanh V Nguyen
(74) *Attorney, Agent, or Firm* — McDonnell Boehnen Hulbert & Berghoff LLP (57) ABSTRACT

Example embodiments relate to RF amplifier packages. One example RF amplifier package includes an input terminal, an output terminal, a substrate, a first DC blocking capacitor having a first terminal and a grounded second terminal, and a second conductor die mounted on the substrate. The semiconductor die includes a semiconductor substrate, an RE power field-effect transistor (FET) integrated on the semiconductor substrate, a gate bondbar, a first drain bondbar, a second drain bondbar, and a plurality of first bondwires connecting the second drain bondbar to the first terminal of the first DC blocking capacitor. The RF power FET includes a plurality of gate fingers that are electrically connected to the gate bondbar and that each extend from the gate bondbar towards the first drain bondbar and underneath the second drain bondbar, a first set of drain fingers, and a second set of drain fingers.

17 Claims, 8 Drawing Sheets

(51) Int. Cl.
*H03F 1/56* (2006.01)
*H03F 3/195* (2006.01)

(52) U.S. Cl.
CPC .............. *H01L 2223/6611* (2013.01); *H01L 2223/6655* (2013.01); *H03F 2200/451* (2013.01)

(58) Field of Classification Search
CPC . H01L 2224/45099; H01L 2224/48091; H01L 2224/48195; H01L 2224/48247; H01L 2224/49052; H01L 2224/49175; H01L 2224/73265; H01L 2924/1421; H01L 2924/19107; H01L 25/16; H01L 23/49; H01L 23/552; H01L 23/642; H01L 23/645; H01L 24/45; H01L 2224/4502; H01L 2924/3011; H03F 1/565; H03F 3/195; H03F 2200/451; H03F 2200/222; H03F 2200/309; H03F 2200/387; H03F 3/213; H03F 3/1935; H03F 3/21; H03F 3/14; H03F 3/187
See application file for complete search history.

(56) References Cited

U.S. PATENT DOCUMENTS

2015/0294930 A1\* 10/2015 Zhu .................. H01L 24/49
257/337
2021/0257977 A1\* 8/2021 Cuoco .................. H03F 3/195

\* cited by examiner

RF AMPLIFIER PACKAGE

CROSS-REFERENCE TO RELATED APPLICATIONS

The present application is a non-provisional patent application claiming priority to Netherlands Patent Application No. NL 2027009, filed Nov. 30, 2020, the contents of which are hereby incorporated by reference.

FIELD OF THE DISCLOSURE

The present disclosure relates to a radiofrequency (RF) amplifier package. The present disclosure further relates to a semiconductor die that is used in such an amplifier package.

BACKGROUND

Figure 1A:
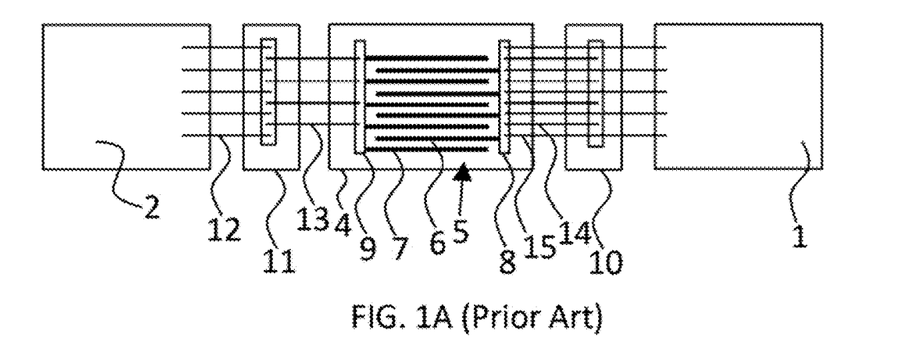
FIG. 1A illustrates a top view of an RF amplifier package, according to the prior art.
Figure 1B:
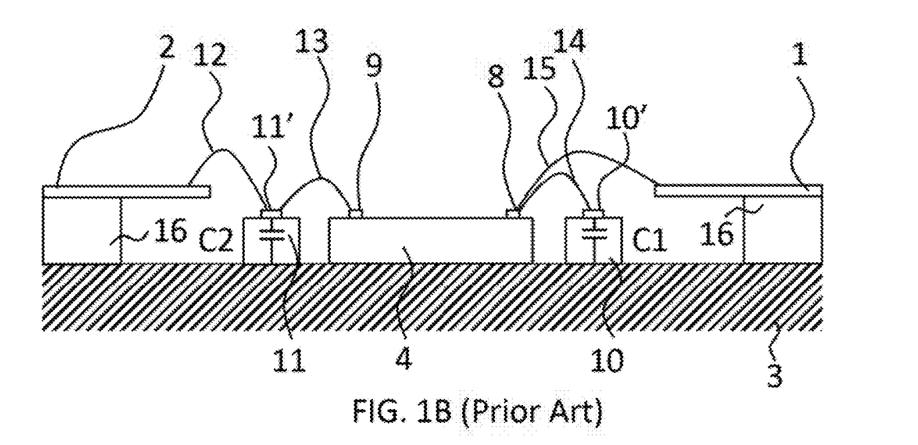
FIG. 1B illustrates a cross-sectional view of an RF amplifier package, according to the prior art.
Figure 1C:
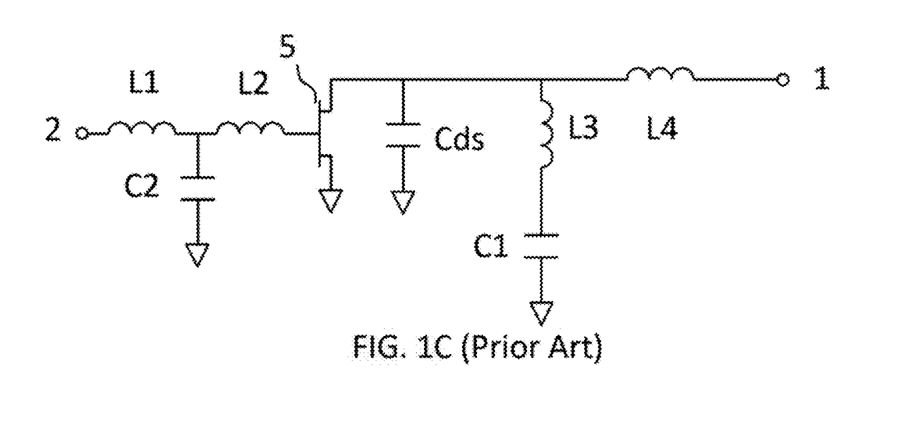
FIG. 1C illustrates an equivalent circuit of an RF amplifier package, according to the prior art.

FIGS. 1A and 1B illustrate a schematic top view and cross-sectional view of a known RF amplifier package, respectively, whereas FIG. 1C illustrates an equivalent circuit thereof.

The known amplifier package has an output terminal 1, an input terminal 2, and a conductive substrate 3. Output terminal 1 and input terminal 2 are separated from substrate 3 using a ceramic ring 16. After assembly of the RF amplifier package on a printed circuit board (PCB), substrate 3 is typically connected to the ground of the PCB.

A semiconductor die 4 is arranged on substrate 3. On this die, an RF power field-effect transistor (FET) 5 is arranged. RF power FET 5 comprises a first set of drain fingers 6 and gate fingers 7, which are electrically connected to a first drain bondbar 8 and a gate bondbar 9, respectively. For example, RF power FET 5 could comprise a silicon based laterally diffused metal-oxide-semiconductor (LDMOS) transistor. Substrate 3 is typically electrically connected to a source of RF power FET 5. Moreover, copper or copper-based substrates may be used as substrate 3 to enable sufficient cooling of RF power FET 5.

The known RF amplifier package further comprises capacitors C1, C2 that may be realized on further semiconductor dies or which may be provided in the form of discrete components. In FIGS. 1A and 1B, capacitors C1 and C2 are formed on semiconductor dies 10, 11, respectively. In FIGS. 1A and 1B, a bondbar 11' is illustrated that is connected to a first terminal of C2 whereas a second terminal of C2 (not shown) is grounded. Similarly, a bondbar 10' is illustrated that is connected to a first terminal of C1 whereas a second terminal of C1 (not shown) is grounded.

A plurality of bondwires 12 extends from input terminal 2 to the first terminal of capacitor C2. As stated above, the second terminal of this capacitor is connected to ground. For example, the substrate material of semiconductor die 11 could be conductive allowing a low ohmic connection from the second terminal of C2, via the substrate of semiconductor die 11, to substrate 3 on which semiconductor die 11 is mounted. It is noted that substrate 3 is most often a conductive substrate that is electrically grounded during use. The plurality of bondwires 12 has a given inductance, which is represented by inductor L1 in the equivalent circuit depicted in FIG. 1C. Another plurality of bondwires 13 extends from the first terminal of C2 to gate bondbar 9. This plurality of bondwires is represented by inductor L2 in FIG. 1C.

From first drain bondbar 8, two pluralities of bondwires extend. A plurality of drain bondwires 15, represented by inductor L4 in FIG. 1C, extends from first drain bondbar 8 to output terminal 1. A plurality of first bondwires 14, represented by inductor L3 in FIG. 1C, extends from first drain bondbar 8 to a first terminal of capacitor C1.

RF power FET 5 comprises parasitic components that influence the behavior of the transistor. One of these components is the output capacitance, which can be represented by a capacitor Cds arranged between the drain and source terminals of RF power FET 5 as illustrated in FIG. 1C. When left unaccounted for, this parasitic capacitance has a strong influence on gain, power, and efficiency of the power amplifier.

A known approach to mitigate the influence of Cds on performance is to make use of an inductor that is placed parallel to Cds. Together these components should display a parallel resonance at or close to the operational frequency of the amplifier. This would ensure that the combined impedance of Cds and the inductor is sufficiently high to no longer significantly degrade the RF behavior of the amplifier.

In FIG. 1C, the abovementioned inductor, which is placed parallel to Cds, is formed by the plurality of first bondwires 14, i.e. L3. Capacitor C1 should be sufficiently large to act as an RF short at or close to the operational frequency. More in particular, the series connection of L3 and C1 should act as an inductance at or close to the operational frequency to allow the parallel resonance with Cds. At DC, C1 blocks a DC path to ground.

Figure 2A:
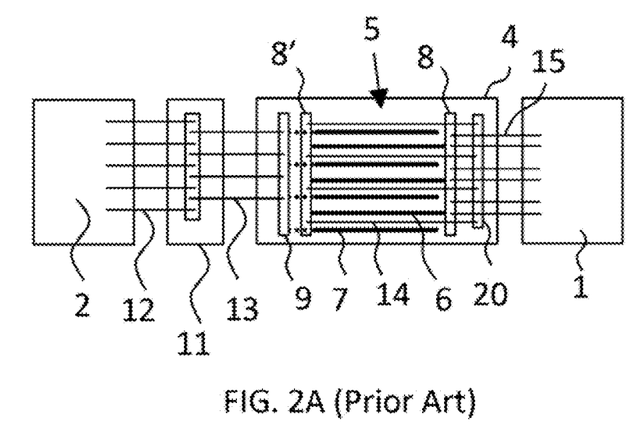
FIG. 2A illustrates a top view of an RF amplifier package, according to the prior art.
Figure 2B:
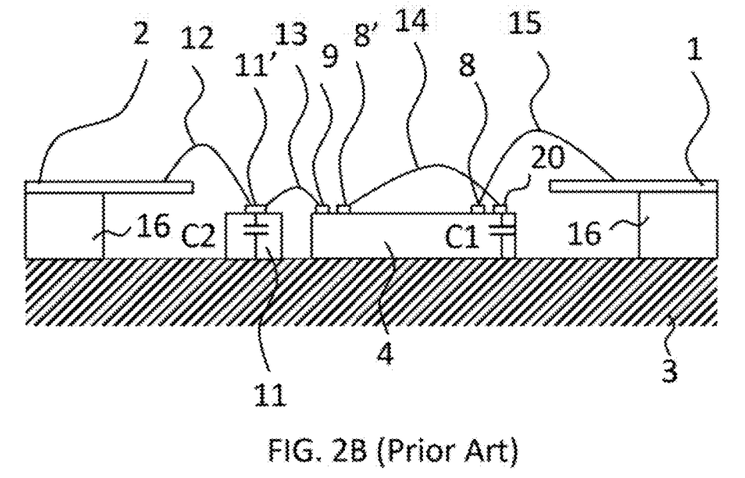
FIG. 2B illustrates a cross-sectional view of an RF amplifier package, according to the prior art.

An RF amplifier package according to the preamble of claim 1 is known from EP 3 499 717 A1. A schematic top view and cross-sectional view of this package is illustrated in FIGS. 2A and 2B, respectively. Comparing FIGS. 1A and 2A, it can be seen that in FIG. 2A, a second drain bondbar 8' is provided. A first set of drain fingers 6 extends between first drain bondbar 8 and second drain bondbar 8'. Furthermore, capacitor C1 is integrated on semiconductor die 4. A first terminal 20 of capacitor C1 is connected to second drain bondbar 8' using a plurality of first bondwires 14. The equivalent circuit of the embodiment in FIG. 2A is similar to that shown in FIG. 1B.

In the embodiment of FIG. 2A, second drain bondbar 8', from which the plurality of first bondwires 14 extends, is different from first drain bondbar 8, from which the plurality of drain bondwires 15 extends. Furthermore, because second drain bondbar 8' is shifted more towards the input side of semiconductor die 4, there will be less overlap between the current loop associated with the plurality of first bondwires 14 and the current loop associated with the plurality of drain bondwires 15. This will result in a lower coefficient of mutual inductance between L3 and L4 in FIG. 1C. Consequently, the efficiency and output impedance of the power amplifier will improve.

Despite the advantages of using a second drain bondbar, the Applicant has found that the layout of FIG. 2A is not optimal for RF amplifier packages operating at relatively high frequencies.

It is therefore an object of example embodiments to provide an RF amplifier package having improved high-frequency performance.

SUMMARY

According to the present disclosure this object has been achieved using the RF amplifier package according to claim 1 that is characterized in that the RF power FET further comprises a second set of drain fingers that each extend in an area between the second drain bondbar and the gate bondbar, wherein each of the plurality of gate fingers is operatively coupled with a respective drain finger of the first and second set of drain fingers. By using the modified positioning of the second drain bondbar it becomes possible to use shorter first bondwires thereby increasing the resonance frequency of L3 and Cds and allowing the RF amplifier package to be operated at higher frequencies.

Compared to the embodiment shown in FIG. 2A, the RF power FET of the present disclosure comprises at least two amplifying segments, i.e. a first segment corresponding to the first set of drain fingers and to the part of the gate fingers that is positioned adjacent to those drain fingers, and a second segment corresponding to the second set of drain fingers and to the part of the gate fingers that is positioned adjacent to those drain fingers.

Each drain finger of the first set of drain fingers is arranged in line with a respective drain finger of the second set of drain fingers for forming a respective pair of aligned drain fingers. Furthermore, each of the plurality of gate fingers is operatively coupled with a respective pair of aligned drain fingers.

Each drain finger of the first set of drain fingers can be connected to the second drain bondbar at or near a first edge of the second drain bondbar and/or each drain finger of the second set of drain fingers can be connected to the second drain bondbar at or near a second edge of the second drain bondbar opposite to said first edge. For example, the semiconductor die may comprise a metal layer stack arranged on the semiconductor substrate that includes a plurality of metal layers, wherein the second drain bondbar is formed in an uppermost metal layer of the metal layer stack relative to the semiconductor substrate, and wherein the drain fingers of the first and second set of drain fingers and the gate fingers are formed, at least at the position of the second drain bondbar, in one or more lower lying metal layers. Each drain finger of the first and second set of drain fingers may be connected to the second drain bondbar through a respective via between the uppermost metal layer and said one or more lower lying metal layers. This via can be arranged at or near an edge of the second drain bondbar. In addition, the second drain bondbar may comprise a substantially rectangular base to which the plurality of first bondwires is bonded and a plurality of protrusions extending from said base in a direction parallel to a longitudinal direction of the gate fingers, wherein each respective via ends in a respective protrusion among the plurality of protrusions.

The vias used for electrically connecting the drain fingers of the first and second set of drain fingers may transfer mechanical forces that are exerted onto the rectangular base of the second drain bondbar during wire bonding to the underlying drain fingers of the first and second set of drain fingers. By arranging the vias underneath the protrusions, a lateral separation between the vias and the position at which the wire bonding force is exerted can be achieved. The Applicant found that this improves the reliability of the RF amplifier package as it becomes less likely that the wire bonding process introduces damage to the drain fingers or to the gate fingers that extend underneath the second drain bondbar.

In addition to the above, the plurality of protrusions may comprise a plurality of second protrusions that each extend from the rectangular base towards the gate bondbar, wherein each drain finger of the second set of drain fingers is connected using a respective via between that finger and a respective second protrusion. Additionally, or alternatively, the plurality of protrusions may comprise a plurality of first protrusions that each extend from the rectangular base towards the first drain bondbar, wherein each drain finger of the first set of drain fingers is connected using a respective via between that finger and a respective first protrusion.

The RF power FET may further comprise a third set of drain fingers, wherein each drain finger of the first set of drain fingers is integrally connected to a respective drain finger of the second set of drain fingers via a respective drain finger of the third set of drain fingers to thereby form a respective continuous drain finger extending in a same metal layer of the metal layer stack. In this embodiment, the drain fingers of the RF power FET may be of substantially the same length as the gate fingers. Each drain finger may comprise a first segment corresponding to a drain finger of the first set of drain fingers, a third segment corresponding to a drain finger extending underneath the second drain bondbar, and a second segment corresponding to a drain finger of the second set of drain fingers.

The RF power FET may further comprise a plurality of shields formed in at least one of said one or more lower lying metal layers, each shield being associated with a respective gate finger and being arranged at least underneath the second drain bondbar in between the second drain bondbar and that gate finger. The use of shields in accordance with the present disclosure is particularly relevant as the second drain bondbar may capacitively couple with gate fingers that extend underneath it. Preferably, each gate finger has a first side and a second side opposite to the first side, wherein the plurality of shields comprises a plurality of first shields and a plurality of second shields, each first shield being associated with a respective gate finger and being arranged at least underneath the second drain bondbar in between the second drain bondbar and the first side of that gate finger, and each second shield being associated with a respective gate finger and being arranged at least underneath the second drain bondbar in between the second drain bondbar and the second side of that gate finger. In a particular embodiment, the first and second shield corresponding to a same gate finger can be integrally connected.

Each drain finger of the first set of drain fingers may extend over a first active area formed in the substrate in between the second drain bondbar and the first drain bondbar, and each drain finger of the second set of drain fingers may extend over a second active area formed in the substrate in between the second drain bondbar and the gate bondbar. For each gate finger, the first active area and second active area associated with that finger are preferably adjoined for forming a single continuous active area. In this embodiment, the second drain bondbar is therefore arranged over an active area. However, the present disclosure does not exclude embodiments in which the second drain bondbar is not arranged over active area. In such embodiment, the first and second areas are not adjoined.

The RF amplifier package may further comprise a second DC blocking capacitor having a first terminal and a grounded second terminal, and a plurality of second bondwires connecting the second drain bondbar to the first terminal of the second DC blocking capacitor. By using a combination of a first and second DC blocking capacitor, more bondwires can be arranged in parallel thereby reducing the shunt inductance to ground. In this manner, the resonance frequency at which the output capacitance is compensated can be increased even further. More in particular, the plurality of first bondwires and the first DC blocking capacitor, and, if the plurality of second bondwires are provided, the plurality of second bondwires and the second DC blocking capacitor, preferably act together as a shunt inductor at a frequency near or within the operational frequency range, said shunt inductor resonating with the output capacitance at that frequency.

The semiconductor die may comprise a first edge and an oppositely arranged second edge, wherein the first edge of the semiconductor die is arranged between the input terminal and the gate bondbar and wherein the second edge of the semiconductor die is arranged between the output terminal and the first drain bondbar. The first DC blocking capacitor may be arranged near one edge among the first and second edge. In addition, the second DC blocking capacitor can be arranged near a different edge among the first and second edge of the semiconductor die than the first DC blocking capacitor. Additionally, or alternatively, at least one of the first and second DC blocking capacitor is integrated on the semiconductor die.

The RF power FET can be a silicon based laterally diffused metal-oxide-semiconductor (LDMOS) transistor or a gallium nitride-based FET. Moreover, the operational frequency range may lie in between 100 MHz and 40 GHz, preferably between 500 MHz and 10 GHz.

According to a second aspect, the present disclosure further provides a semiconductor die that is configured as the abovementioned semiconductor die of the RF amplifier package comprising the RF power FET.

BRIEF DESCRIPTION OF THE DRAWINGS

Next, example embodiments will be described in more detail by referring to the appended drawings.

DETAILED DESCRIPTION

Figure 3A:
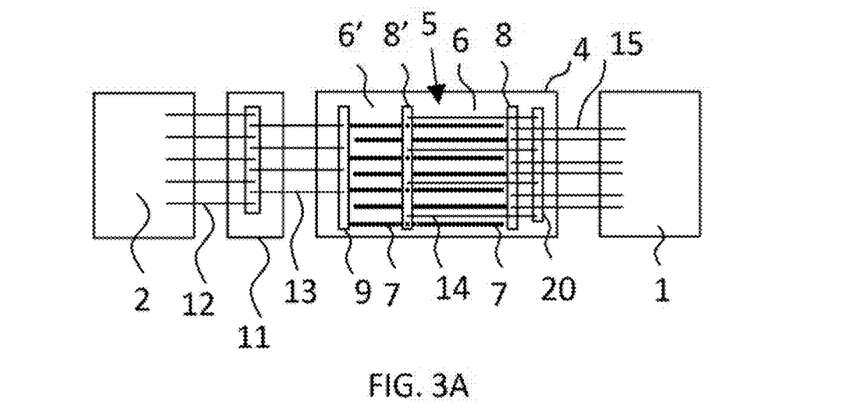
FIG. 3A illustrates a top view of an RF amplifier package, according to example embodiments.
Figure 3B:
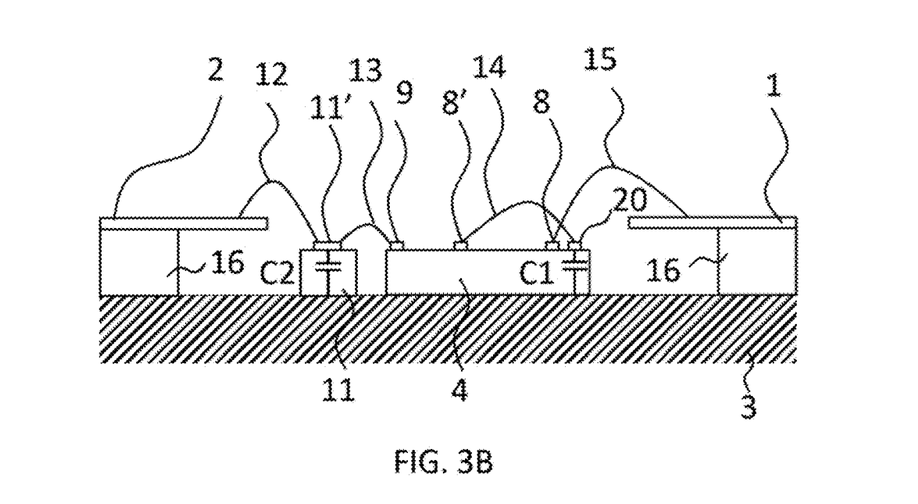
FIG. 3B illustrates a cross-sectional view of an RF amplifier package, according to example embodiments.

FIG. 3A illustrates a top view of an embodiment of an RF amplifier package in accordance with the present invention. A corresponding cross sectional view is illustrated in FIG. 3B. Here, the same reference signs are used as for the known RF amplifier packages shown in FIGS. 1-2 to indicate identical or similar components.

It is noted that the present invention is not limited to a particular packaging technology. More in particular, although FIG. 3A illustrates a ceramic ring 16 for separating input terminal 2 and output terminal 1 from conductive substrate 3, the skilled person will readily understand that the present invention can be applied to other packaging technologies as well. For example, the present invention may be applied in molded leadframe packages. In these packages, a solidified molding compound is used for separating terminals 1, 2, which are shaped as leads, and substrate 3. A cross section of such package would be similar to that of FIG. 3B with the exception that ceramic ring 16 would be replaced by a body of solidified molding compound. Moreover, a cover could be arranged to provide an air cavity inside the package. Alternatively, the cover could be formed during the molding process itself. In such packages, all the electronic components are completely encapsulated by solidified molding compound. In addition, instead of molded leadframe packages, the present invention may equally be applied in flat no-leads packages, such as DFN or QFN. Furthermore, substrate 3 can be in the form of a metal flange, metal die pad, or other heat and/or electricity conducting medium.

Comparing FIG. 3A to FIG. 2A, it becomes clear that according to the present invention, second drain bondbar 8' is positioned closer to first drain bondbar 8. Moreover, in addition to a first set of drain fingers 6 that extends in between second drain bondbar 8' and first drain bondbar 8, a second set of drain fingers 6' is provided that extends in between second drain bondbar 8' and gate bondbar 9. In FIG. 3A, drain fingers 6 extend from one edge of second drain bondbar 8' towards first drain bondbar 8, whereas drain fingers 6' extend from an opposing edge of second drain bondbar 8' towards gate bondbar 9. More in particular, drain fingers 6' are connected to drain fingers 6 solely through second drain bondbar 8'. In FIG. 3A, gate fingers 7 each extend underneath second drain bondbar 8'.

By varying the position of second drain bondbar 8', the length for bondwires 14 can be tuned for a given operational frequency range. For example, when the RF amplifier package should operate at relatively high frequencies, the position of second drain bondbar 8' must be designed to be closer to first drain bondbar 8.

As will be explained later in connection with FIGS. 7A-7D, each drain finger 6 of the first set of drain fingers may also be connected to a respective drain finger 6' of the second set of drain fingers to form a single continuous drain finger. This single continuous drain finger passes underneath second drain bondbar 8'.

In FIG. 3A, DC blocking capacitor C1 is integrated on semiconductor die 4. It comprises a first terminal that is connected to a bondbar 20 or bondpad and a second grounded terminal. This latter terminal will be grounded during use. For example, the semiconductor substrate of semiconductor die 4 may be conductive allowing a connection to ground through this substrate and conductive substrate 3, wherein the latter is fixedly connected to a ground plane on the PCB on which the RF amplifier package is mounted.

Figure 4A:
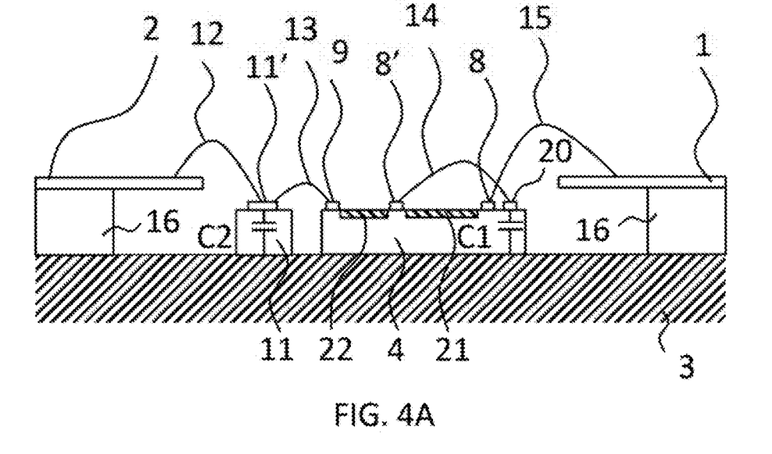
FIG. 4A illustrates a cross-sectional view of an RF amplifier package indicating the active areas of the RF power FET, according to example embodiments.
Figure 4B:
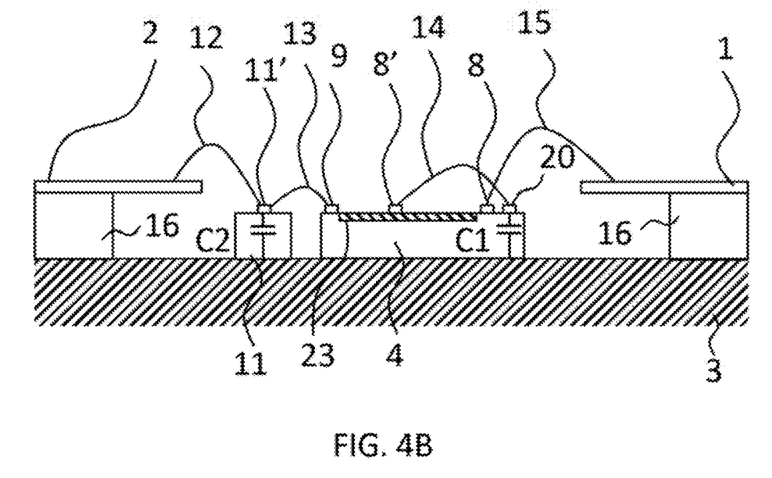
FIG. 4B illustrates a cross-sectional view of an RF amplifier package indicating the active areas of the RF power FET, according to example embodiments.

FIGS. 4A and 4B illustrate examples of an RF amplifier package in accordance with the present invention indicating the active areas. Here, FIG. 4A indicates that separate active areas 21, 22 are formed on opposing sides of second drain bondbar 8'. In this embodiment, it is possible to connect drain fingers 6' and drain fingers 6 only through second drain bondbar 8'. This is different from the embodiment in FIG. 4B where a continuous active area is formed for each gate finger 7. In this latter embodiment, drain fingers 6 and drain fingers 6' are mutually connected using drain fingers 6". This is illustrated in more detail in FIG. 6.

Figure 5:
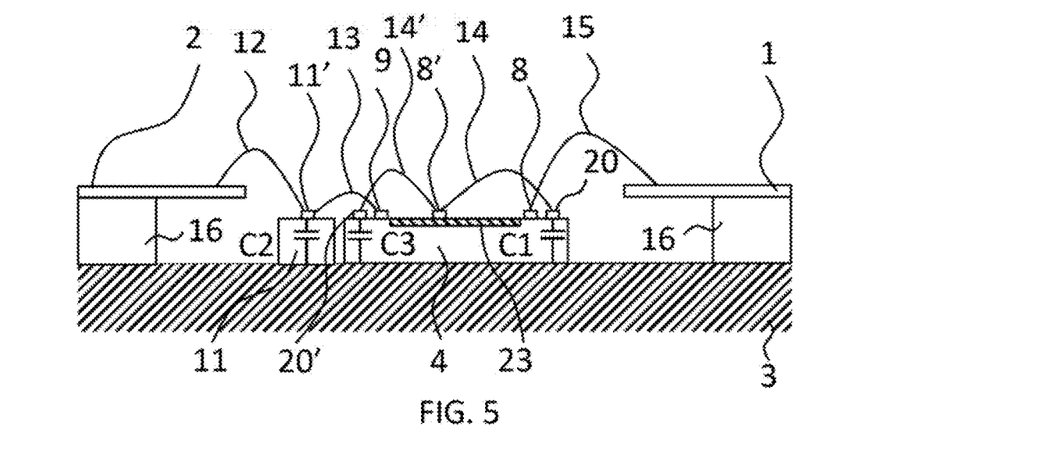
FIG. 5 illustrates a cross-sectional view of an RF amplifier package, according to example embodiments.

FIG. 5 illustrates a cross sectional view of a further embodiment of an RF amplifier package in accordance with the present invention. In this embodiment, a further DC blocking capacitor C3 is arranged on the gate side of semiconductor die 4. Capacitor C3 has a grounded terminal and a non-grounded terminal, wherein the latter terminal is connected to a bondbar 20' or a bondpad. Bondwires 14' connect the non-grounded terminal of capacitor C3 to second drain bondbar 8'.

The combination of bondwires 14' and capacitor C3 forms a shunt LC network of which the resonance frequency is considerably lower than the operational frequency range of the RF amplifier package. Similar considerations hold for the combination of bondwires 14 and capacitor C1. Put differently, at the operational frequency, RF power FET 5 sees its output capacitance Cds arranged in parallel to the inductance formed by bondwires 14 and the inductance formed by bondwires 14'. By using two shunt LC networks, a higher resonance frequency can be obtained thereby allowing the RF amplifier package to be operated at higher frequencies.

As shown in FIG. 5, bondbar 20' is arranged in between gate bondbar 9 and bondbar 11'. However, the present invention does not exclude embodiments in which bondbar 20' is arranged in between gate bondbar 9 and second drain bondbar 8'. In other embodiments, capacitor C3 is integrated on semiconductor die 11, either in between input terminal 2 and bondbar 11' or in between bondbar 11' and gate bondbar 9. Furthermore, in this and other embodiments, C2 may be arranged on semiconductor die 4.

Figure 6:
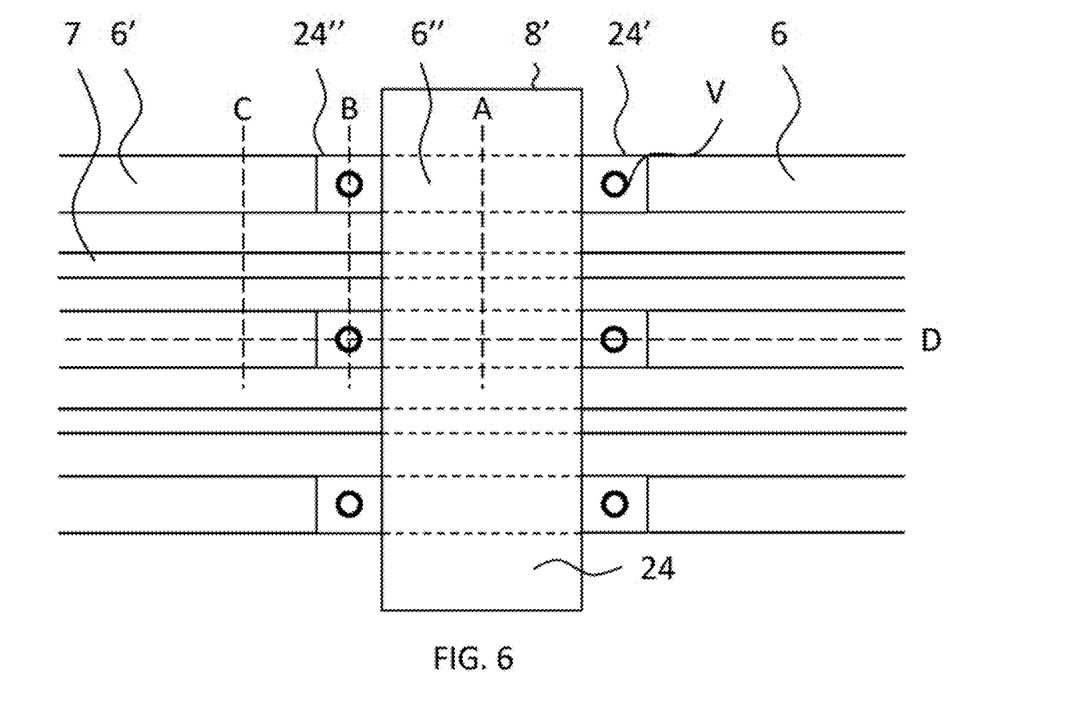
FIG. 6 illustrates a detailed top view of the second drain bondbar, according to example embodiments.

FIG. 6 illustrates a detailed top view of an embodiment of second drain bondbar 8'. FIGS. 7A-7D illustrate cross sectional views illustrating the layer stack corresponding to second drain bondbar 8'. The configuration of second drain bondbar 8' can be applied to the embodiments shown in FIGS. 3A, 4A, 4B, and 5.

As shown in FIG. 6, each drain finger 6' of the second set of drain fingers is arranged in line with a respective drain finger 6 of the first set of drain fingers. Furthermore, second drain bondbar 8' comprises a rectangular base 24 from which first protrusions 24' extend toward first drain bondbar 8 and from which second protrusions 24" extend toward gate bondbar 9.

Each first protrusion 24' is connected to a respective drain finger 6 of the first set of drain fingers and each second protrusion 24" is connected to a respective drain finger 6' of the second set of drain fingers. These connections are achieved using metal to metal vias V. Furthermore, gate fingers 7 extend underneath second drain bondbar 8'.

FIG. 6 indicates three dotted lines that indicate lines along which cross sectional views are obtained. More in particular, FIG. 7A corresponds to line A, FIG. 7B to line B, and FIGS. 7C and 7D are two possibilities for line C.

Figure 7A:
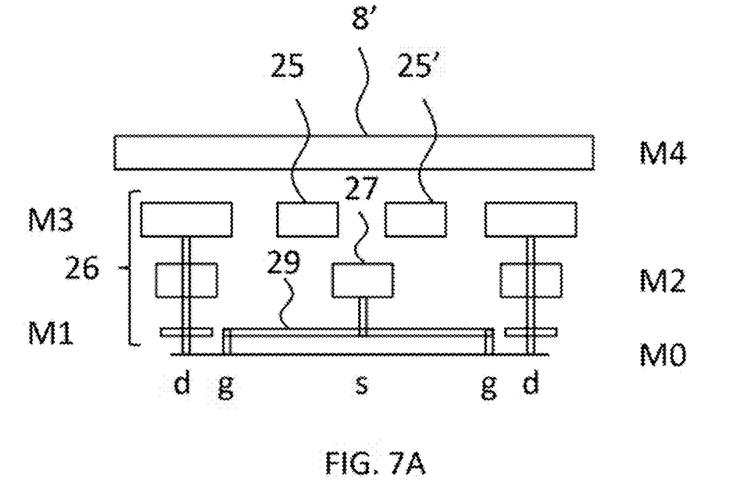
FIG. 7A illustrates a cross-sectional view of a layer stack corresponding to the embodiment in FIG. 6, according to example embodiments.

FIG. 7A illustrates a cross sectional view corresponding to line A in FIG. 6. As can be seen, a metal layer stack comprising 5 metal layers M0-M4 is provided on semiconductor die 4 although the present invention is not limited to this number of layers.

The lowest lying metal layer M0 is used for connecting to the intrinsic drain and gate contacts of RF power FET 5. In FIGS. 7A-7D, letter "d" is used to refer to the intrinsic drain contact, letter "g" to refer to the intrinsic gate contact, and letter "s" indicates the source region, which is typically grounded during operation. For example, the source region is connected to conductive substrate 3 through vias inside semiconductor die 4. Alternatively, the semiconductor substrate of semiconductor die 4 is electrically conductive.

FIG. 7A illustrates that the intrinsic drain contact is connected underneath second drain bondbar 8' to metal stripes 26 on metal layers M1, M2, and M3. These stripes in combination with the intrinsic drain contact are jointly referred to in FIG. 6 as a drain finger 6" of a third set of drain fingers. It should be noted that connection between the various metal layers is achieved using vias. These vias are spaced apart in the direction along the longitudinal direction of gate fingers 7. Accordingly, a cross sectional view taken underneath second drain bondbar 8' at a different position may not show these vias. This also holds for the cross-sectional views in FIGS. 7B-7D.

Also shown in FIG. 7A is that the intrinsic gate contact is connected to metal layer M1 and metal layer M2. More in particular, a large stripe 27 is present on metal layer M2. This stripe is connected at spaced apart positions to smaller stripes 28 on metal layer M1. FIG. 7A shows a connection 29 between stripes 28 on metal layer M1 and stripe 27 on metal layer M2, whereas FIG. 7B does not as this cross-sectional view is taken at a different position that does not coincide with the position of the abovementioned connection. Stripe 27 on metal layer M2 is referred to in FIG. 6 as gate finger 7.

FIG. 7A further indicates shield fingers 25, 25' that are connected to the source region using a plurality of vias (not shown) and lateral connections similar to connection 29 (not shown). Shield fingers 25, 25' limit the feedback capacitance between second drain bondbar 8' and gate finger 7.

Figure 7B:
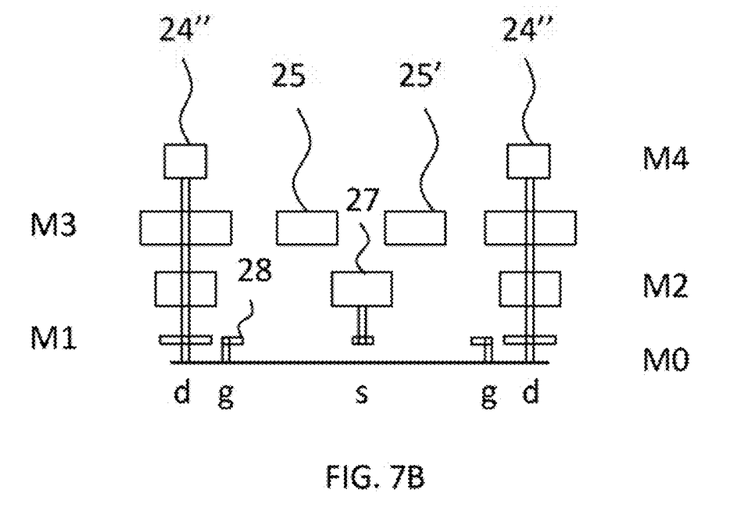
FIG. 7B illustrates a cross-sectional view of a layer stack corresponding to the embodiment in FIG. 6, according to example embodiments.
Figure 7C:
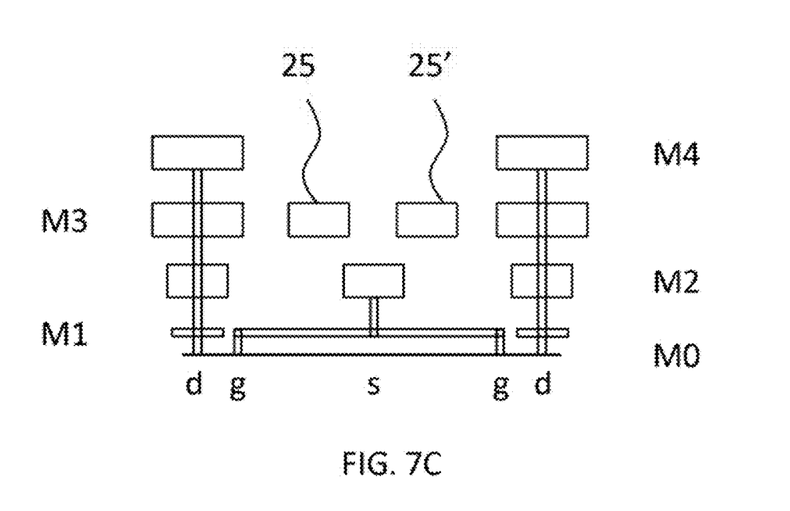
FIG. 7C illustrates a cross-sectional view of a layer stack corresponding to the embodiment in FIG. 6, according to example embodiments.
Figure 7D:
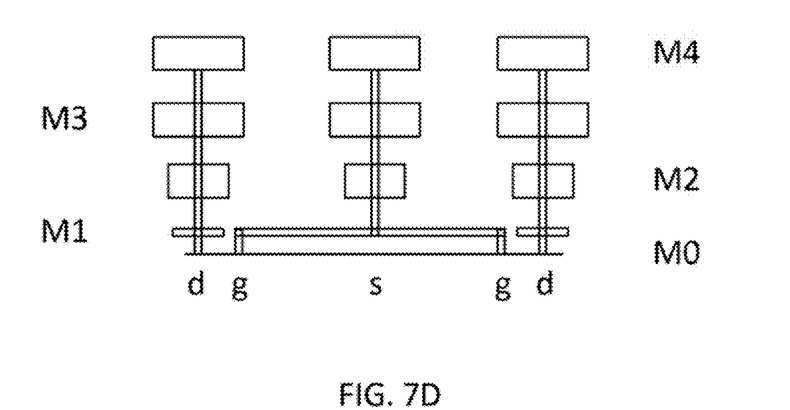
FIG. 7D illustrates a cross-sectional view of a layer stack corresponding to the embodiment in FIG. 6, according to example embodiments.

As can be seen in FIG. 7B, drain finger 6' is connected to second protrusions 24" using vias between metal layers M3 and M4. Moreover, metal layers M3, M2, and M1 of drain finger 6' are integrally connected to metal layers M3, M2, and M1 of drain finger 6". Similarly, metal layers M3, M2, and M1 of drain finger 6 are integrally connected to metal layers M3, M2, and M1 of drain finger 6". Furthermore, as shown in FIG. 7C, outside of second drain bondbar 8', drain finger 6' (and drain finger 6) may also include a track on metal layer M4 for reducing inductance and/or resistance of drain finger 6'. The same may apply for gate finger 7 as shown in FIG. 7D. This latter figure also shows that in this case shield fingers 25, 25' are not applied outside of second drain bondbar 8'.

Figure 7E:
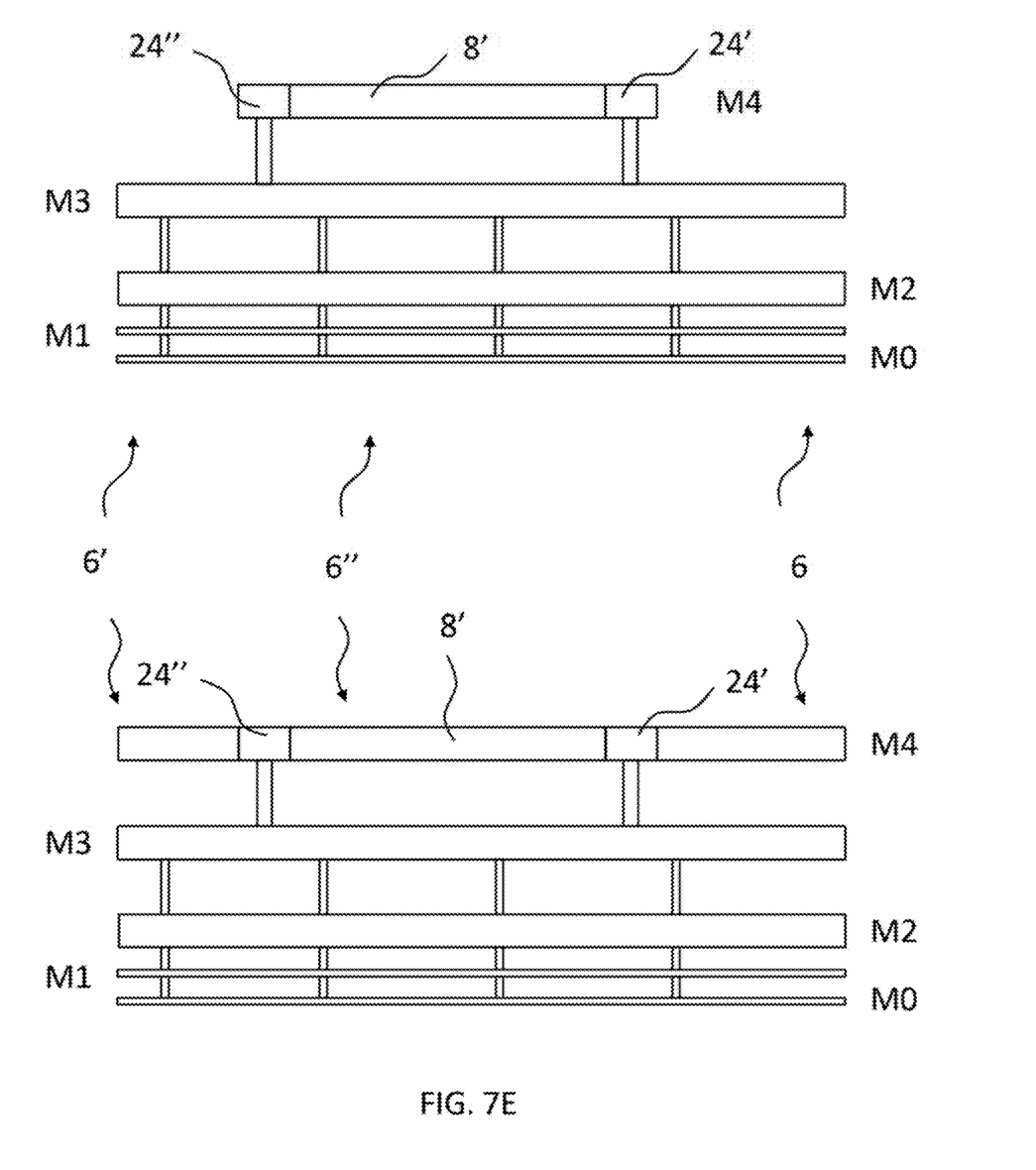
FIG. 7E illustrates a cross-sectional view of a layer stack corresponding to the embodiment in FIG. 6, according to example embodiments.

FIG. 7E shows two possible cross sections taken along line D in FIG. 6. In FIG. 7E, top figure, drain fingers 6, 6', 6" each extend in metal layers M0, M1, M2, and M3. As shown, these layers are mutually connected using vias. Drain fingers 6, 6' are connected to first protrusion 24' and second protrusion 24", respectively, which are realized in metal layer M4. In FIG. 7E, bottom figure, drain fingers 6, 6' are realized also in metal layer M4. In this latter case, the metal layer M4 part of drain finger 6" is integrally formed with second drain bondbar 8'.

In the abovementioned description, the present invention has been explained using detailed embodiments thereof. However, the present invention is not limited to these embodiments and various modifications are possible without deviating from the scope of the invention which is defined by the appended claims.

What is claimed is:

1. A radiofrequency (RF) amplifier package, comprising:
    an input terminal;
    an output terminal;
    a substrate;
    a first DC blocking capacitor having a first terminal and a grounded second terminal; and
    a semiconductor die mounted on the substrate, wherein the semiconductor die comprises:
        a semiconductor substrate;
        an RF power field-effect transistor (FET) integrated on said semiconductor substrate, the RF power FET having an output capacitance and being configured to operate within an operational frequency range;
        a gate bondbar connected to the input terminal directly or via an input impedance matching stage using a plurality of gate bondwires;
        a first drain bondbar connected to the output terminal directly or via an output impedance matching stage using a plurality of drain bondwires;
        a second drain bondbar arranged in between the gate bondbar and the first drain bondbar; and
        a plurality of first bondwires connecting the second drain bondbar to the first terminal of the first DC blocking capacitor,
        wherein the RF power FET comprises:
            a plurality of gate fingers that are electrically connected to the gate bondbar and that each extend from the gate bondbar towards the first drain bondbar and underneath the second drain bondbar;
            a first set of drain fingers that each extend in an area between the second drain bondbar and the first drain bondbar; and
            a second set of drain fingers that each extend in an area between the second drain bondbar and the gate bondbar,
            wherein each of the plurality of gate fingers is operatively coupled with a respective drain finger of the first and second set of drain fingers,
            wherein the drain fingers of the first set of drain fingers are arranged in line with respective drain fingers of the second set of drain fingers for forming respective pairs of aligned drain fingers, and
            wherein the gate fingers are operatively coupled with respective pairs of aligned drain fingers.

2. The RF amplifier package according to claim 1, wherein each drain finger of the first set of drain fingers is connected to the second drain bondbar at or near a first edge of the second drain bondbar, and wherein each drain finger of the second set of drain fingers is connected to the second drain bondbar at or near a second edge of the second drain bondbar opposite to said first edge.

3. The RF amplifier package according to claim 2, wherein the semiconductor die comprises a metal layer stack arranged on the semiconductor substrate that includes a plurality of metal layers, wherein the second drain bondbar is formed in an uppermost metal layer of the metal layer stack relative to the semiconductor substrate, wherein the drain fingers of the first and second set of drain fingers and the gate fingers are formed, at least at the position of the second drain bondbar, in one or more lower lying metal layers, and wherein each drain finger of the first and second set of drain fingers is connected to the second drain bondbar through a respective via between the uppermost metal layer and said one or more lower lying metal layers, said via being arranged at or near an edge of the second drain bondbar.

4. The RF amplifier package according to claim 3, wherein the second drain bondbar comprises a substantially rectangular base to which the plurality of first bondwires is bonded and a plurality of protrusions extending from said base in a direction parallel to a longitudinal direction of the gate fingers, and wherein each respective via ends in a respective protrusion among the plurality of protrusions.

5. The RF amplifier package according to claim 4, wherein the plurality of protrusions comprises a plurality of second protrusions that each extend from the rectangular base towards the gate bondbar, wherein each drain finger of the second set of drain fingers is connected using a respective via between that finger and a respective second protrusion, wherein the plurality of protrusions comprises a plurality of first protrusions that each extend from the rectangular base towards the first drain bondbar, and wherein each drain finger of the first set of drain fingers is connected using a respective via between that finger and a respective first protrusion.

6. The RF amplifier package according to claim 3, wherein the RF power FET further comprises a third set of drain fingers, and wherein each drain finger of the first set of drain fingers is integrally connected to a respective drain finger of the second set of drain fingers via a respective drain finger of the third set of drain fingers to thereby form a respective continuous drain finger extending in a same metal layer of the metal layer stack.

7. The RF amplifier package according to claim 3, wherein the RF power FET further comprises a plurality of shields formed in at least one of said one or more lower lying metal layers, each shield being associated with a respective gate finger and being arranged at least underneath the second drain bondbar in between the second drain bondbar and that gate finger.

8. The RF amplifier package according to claim 7, wherein each gate finger has a first side and a second side opposite to the first side, and wherein the plurality of shields comprises a plurality of first shields and a plurality of second shields, each first shield being associated with a respective gate finger and being arranged at least underneath the second drain bondbar in between the second drain bondbar and the first side of that gate finger, each second shield being associated with a respective gate finger and being arranged at least underneath the second drain bondbar in between the second drain bondbar and the second side of that gate finger.

9. The RF amplifier package according to claim 8, wherein the first and second shield corresponding to a same gate finger are integrally connected.

10. The RF amplifier package according to claim 1,
    wherein each drain finger of the first set of drain fingers extends over a first active area formed in the substrate in between the second drain bondbar and the first drain bondbar,
    wherein each drain finger of the second set of drain fingers extends over a second active area formed in the substrate in between the second drain bondbar and the gate bondbar, and wherein for each gate finger the first active area and second active area associated with that finger are preferably adjoined for forming a single continuous active area.

11. The RF amplifier package according to claim 1, further comprising:
a second DC blocking capacitor having a first terminal and a grounded second terminal; and
a plurality of second bondwires connecting the second drain bondbar to the first terminal of the second DC blocking capacitor.

12. The RF amplifier package according to claim 11, wherein the plurality of first bondwires, the first DC blocking capacitor, the plurality of second bondwires, and the second DC blocking capacitor together act as a shunt inductor at a frequency near or within the operational frequency range, said shunt inductor resonating with the output capacitance at that frequency.

13. The RF amplifier package according to claim 11, wherein the semiconductor die comprises a first edge and an oppositely arranged second edge,
wherein the first edge of the semiconductor die is arranged between the input terminal and the gate bondbar,
wherein the second edge of the semiconductor die is arranged between the output terminal and the first drain bondbar,
wherein the first DC blocking capacitor is arranged near one edge among the first and second edge, and
wherein the second DC blocking capacitor is preferably arranged near a different edge among the first and second edge of the semiconductor die than the first DC blocking capacitor.

14. The RF amplifier package according to claim 1,
wherein the RF power FET is a silicon based laterally diffused metal-oxide-semiconductor (LDMOS) transistor or a gallium nitride-based FET, and/or
wherein the operational frequency range lies in between 100 MHz and 40 GHz, preferably between 500 MHz and 10 GHz, and/or
wherein the substrate is a conductive substrate that is electrically connected to a source of the RF power FET.

15. The RF amplifier package according to claim 1, wherein the first DC blocking capacitor is integrated on the semiconductor die.

16. The RF amplifier package according to claim 11, wherein the second DC blocking capacitor is integrated on the semiconductor die.

17. A semiconductor die configured as the semiconductor die of the RF amplifier package according to claim 1.

* * * * *